United States Patent [19]

Sawicki

[11] 4,135,191
[45] Jan. 16, 1979

[54] COHERENT DEMODULATOR

[75] Inventor: Joseph J. Sawicki, Lighthouse Point, Fla.

[73] Assignee: The Bendix Corporation, Southfield, Mich.

[21] Appl. No.: 805,676

[22] Filed: Jun. 13, 1977

[51] Int. Cl.$^2$ .............................................. G01S 3/20
[52] U.S. Cl. .................................. 343/121; 329/122
[58] Field of Search ......................... 343/121; 329/122

[56] References Cited
U.S. PATENT DOCUMENTS 3,390,392   6/1968   Mayer et al. ..................... 343/121 X Primary Examiner—Maynard R. Wilbur
Assistant Examiner—Richard E. Berger
Attorney, Agent, or Firm—W. G. Christoforo; Bruce L. Lamb

[57] ABSTRACT

A coherent demodulator for recovering the phase modulation from an input intermediate frequency signal includes a phase locked loop having switchable frequency and phase detectors. During initial acquisition the phase locked loop frequency is adjusted to be equal to the input intermediate frequency by comparing the loop frequency with the input frequency in the frequency detector and using the resulting error signal to adjust the loop frequency. After acquisition the phase detector maintains the loop frequency phase locked to the input frequency by now using the resulting error signal to adjust loop frequency phase, the error signal from the phase detector being the recovered phase modulation. A second control loop includes a narrow pass filter tuned to the desired frequency of the loop frequency. The error signal from the second loop is summed with the first mentioned error signal to precisely maintain loop frequency.

6 Claims, 9 Drawing Figures

COHERENT DEMODULATOR

BACKGROUND OF THE INVENTION

This invention relates to means for recovering the modulation from a modulated signal and more particularly to a coherent demodulator which recovers phase modulation from a phase modulated signal and to means for stabilizing the coherent demodulator to permit its use.

Modern automatic radio direction finders (ADF) for aircraft use an antenna which is fixed to the skin of the aircraft and which includes what are known as loop and sense elements. In this description the word "loop" is used to describe different elements in various arts. Specifically, in the ADF art a loop element or antenna is a type of radiated signal response circuit which provides a portion of the signal input into the ADF receiver. In the phase locked loop art a loop is the closed circuit which includes usually at least a voltage controlled oscillator and a phase comparator. In the description to follow the two usages of the term "loop" are distinguished by use of the expression "loop element" or "loop antenna" when referring to the ADF art element and use of the term "loop" without the aforementioned qualifiers to refer to the phase locked loop art circuit. Continuing the discussion of the background, the loop element comprises two mutually perpendicular ferrite rods and electrical windings thereon. The amplitudes of the signals induced in the various windings by an electromagnetic field of the type radiated by a radio broadcast station is dependent upon the orientation of the loop elements with respect to the broadcast station. By considering the amplitudes of the induced signals the direction of the broadcast station from the loop elements can be ascertained with a 180° ambiguity. The ADF antenna thus also includes an omnidirectional sense antenna which provides phase information to resolve the ambiguity.

Since the ADF antenna is located on the skin of the aircraft and the ADF receiver and other processing circuits are located in the pilot's cabin or cockpit, it is necessary to provide some convenient means for carrying the antenna signals to the receiver. This is accomplished by mixing the loop antenna signals individually with a low frequency square wave and modulating the sense antenna signals therewith. The resulting phase modulated signal contains all the radio direction information and it is conveyed to the ADF receiver through a single cable. It now remains to demodulate the signal at the receiver to obtain the direction information in a format which can be used to drive the ADF display. Demodulation is accomplished in a coherent demodulator comprising a phase locked loop having the modulated receiver intermediate frequency as an input. A reference signal generated in the phase locked loop is frequency compared against the receiver IF during capture and subsequently phase compared against receiver IF during locked operation of the phase locked loop. The phase locked loop error signal comprises the recovered phase modulation. Long time constant filters are used in the phase locked loop to prevent the rapidly varying phase modulation from affecting the loop generated frequency signal. A stability control loop which compares the phase locked loop frequency with the same frequency as passed through a narrow pass filter helps maintain the proper loop frequency and permits use of the coherent demodulator. The demodulated signals can be further processed to produce d.c. signals which can be applied to orthogonal windings on an ADF indicator to provide an ADF display.

As known to those skilled in the art airline ADF's normally comprise receivers capable of selecting stations separated by 500 Hz. However, general aviation ADF receivers seldom provide such selectivity. Instead, the general aviation pilot normally selects an ADF frequency 500 Hz above or below the assigned frequency. For example, for an assigned station frequency of 245.5 KHz the pilot's ADF control head will read 245 or 246 KHz. For conventional ADF receivers, i.e., those not having a coherent demodulator, the degradation from 500 Hz mistuning is acceptable, thus general aviation ADF's are less complex than airline ADF's. However, when a coherent demodulator is used the acquisition bandwidth is increased by 500 Hz plus station tolerance. In the system to be described the coherent demodulator can acquire lock to a carrier within ±770 Hz of the selected ADF frequency. This is adequate to cover receiver, ground station and VCO environmental drift. The locked bandwidth of the coherent demodulator to be described is approximately 6 Hz with a damping factor of 0.6. Thus, since the coherent demodulator loop bandwidth can only, practically, be reduced to about 6 Hz, while the demodulated information is about 31 Hz, it becomes important to control loop environmental drifts that might otherwise cause bearing errors.

It is thus an object of this invention to provide radio automatic direction finding equipment which provides a display of bearing from the equipment to a radio station.

Another object of the invention is to provide a stabilized coherent demodulator of an ADF receiver.

These and other objects of the invention will become apparent from a reading and understanding of the following description of one embodiment of the invention.

DESCRIPTION OF THE PREFERRED EMBODIMENT

Figures 1, 9:
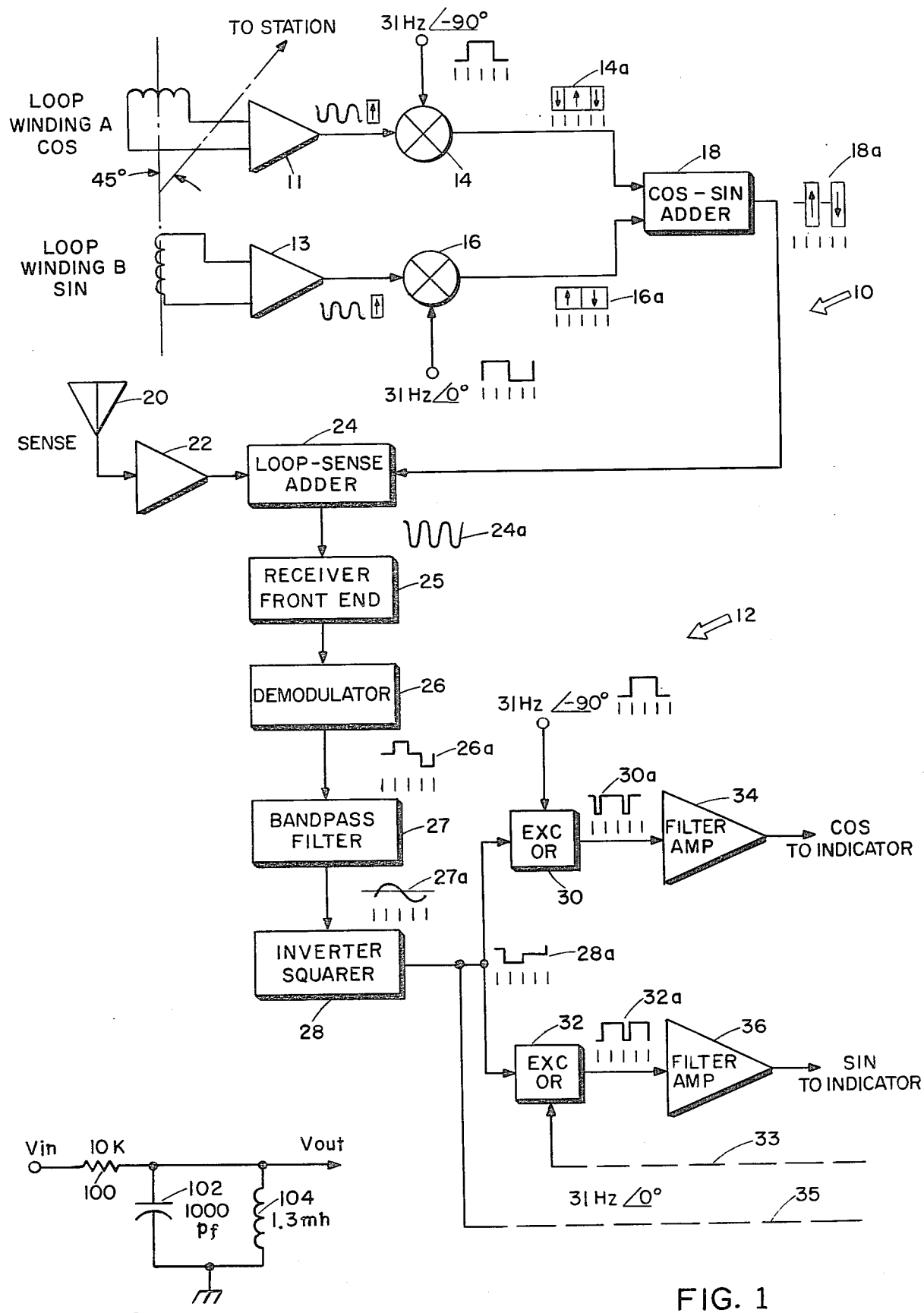
FIG. 1 is a block diagram of an ADF system.
FIG. 9 shows filter 70 in greater detail.

Referring to the figures wherein like numerals refer to like elements and referring particularly to FIG. 1, an aircraft ADF system is seen to be comprised of an antenna section 10, a receiver section 12 and indicators and other displays (not shown). The antenna section is comprised of a loop antenna having a winding A which is arranged to have its longitudinal axis perpendicular to the aircraft fore-to-aft centerline and a winding B which is perpendicular to winding A. The windings are wound on mutually perpendicular ferrite bars (not shown). As known to those skilled in the art the relative amplitude of the signal induced in winding A by a broadcast station is related to the sine of the angle between the aircraft heading and the station, while the relative amplitude of the signal induced in winding B is related to the cosine of the same angle. In other words, winding A has peak voltage induced when the received station is straight ahead or straight behind and minimum voltage when the station is 90° to the right or left. Winding B has peak voltage induced when the station is 90° to the right or left and minimum voltage when the station is straight ahead or straight behind. If the aircraft (and hence the attached ADF antenna) is rotated through 360°, the voltages across the two windings rise and fall according to the angle between the aircraft heading and the station direction.

In describing the remaining elements of FIG. 1 and the operation thereof the following convention is adopted for ease and convenience in explaining the signal processing performed. The amplitude of an rf signal at a given point in the circuit is indicated by the height of a rectangle placed adjacent that point. An arrow in a box represents the phase of the rf signal at that point. Specifically, an arrow pointing up indicates the signal is 90° ahead of the signal induced in the sense antenna. This phase lead is due to the inherent phase difference between the magnetic component of the rf signal induced in the loop antenna and the electrical component of the rf signal induced in the sense antenna. An arrow pointing down in a rectangle indicates that the rf signal lags the sense antenna signal by 90° ($-90°$). In addition, it is assumed in the present discussion that the received station is broadcasting within a range of about 200 to 1799 KHz at an angle of 45° from the aircraft fore-aft centerline. A locally generated 31 Hz modulating square wave is also assumed.

The signals induced by the received station signal in windings A and B are applied, respectively, through balanced amplifiers 11 and 13 to balanced modulators 14 and 16. A 31 Hz square wave is also applied to balanced modulator 16 and the same 31 Hz square wave delayed by 90° is applied to balanced modulator 14. According to the convention adopted above, the rf signals from the various loop windings are in phase with one another and of equal amplitude since the received station is at a 45° relative bearing from the aircraft.

A balanced modulator such as modulator 14 or 16 passes an input rf signal to its output terminal without phase reversal when the square wave modulation input is positive, but reverses the phase of the input signal when the modulation input is negative. Thus, the rf signal issuing from balanced modulator 14 lags the sense signal by 90° over its first quarter cycle, leads by 90° over the next half cycle and again lags by 90° over the last quarter cycle as shown in signal representation 14a. As to this signal representation please note that such signal representation is of one complete cycle of the 31 Hz modulating voltage and the index lines below each representation divide the cycle into quarters. This convention is standard for FIG. 1.

The rf signal from balanced modulator 16 leads the sense signal by 90° over the first half cycle and lags the sense signal by 90° over the second half cycle as shown by signal representation 16a.

The modulated signals are combined in adder 18 to produce the rf signal represented by 18a which shows a null during the first and third quarters, a 90° leading signal during the second quarter and a 90° lagging signal during the last quarter.

As previously mentioned, an omnidirectional sense antenna such as antenna 20 is required to resolve the 180° ambiguity which exists in the loop antenna signals. The sense antenna signal as amplified by balanced amplifier 22 is added to the signal from adder 18 in loop-sense adder 24 to produce the rf signal represented at 24a and which is phase modulated with complete station direction information.

The signal from adder 24 is applied to the receiver front end 25 wherein the received broadcast station is selected and the applied signal reduced to the receiver intermediate frequency (IF). The IF signal is then applied to demodulator 26 to produce the phase modulation represented at 26a. As might be expected, the modulation is impressed on the 31 Hz modulation signal which is smoothed by band-pass filter 27 to produce the signal shown at 27a. This signal is then inverted and squared by circuit 28 to produce the signal represented at 28a, which signal is applied together with the same 90° lagging 31 Hz square wave applied to mixer 14 to exclusive OR circuit 30 and to exclusive OR circuit 32 together with the 31 Hz square wave. The resulting signals represented at 30a and 32a respectively are low pass filtered in elements 34 and 36 respectively and applied as d.c. voltages to the cosine and sine channels of an appropriate ADF indicator.

As known to those skilled in the art the signal represented at 28a, normally termed the variable signal, when compared with the reference 31 Hz $\angle$ 0° signal permits all the bearing information to be extracted by equipment other than that shown in this embodiment. Lines 33 and 35 indicate lines for tapping these signals if desired for such auxiliary indicating or other means.

Figure 2:
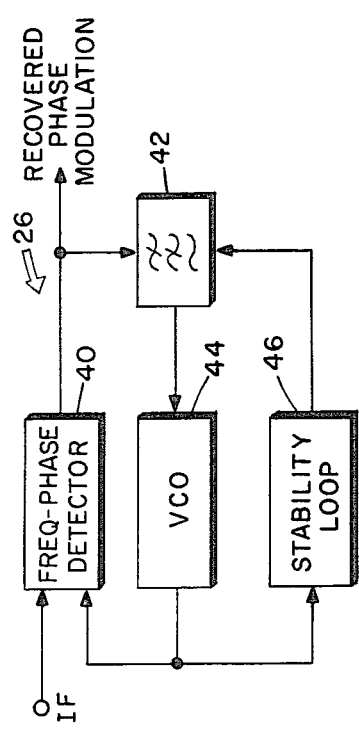
FIG. 2 is a simplified block diagram of a coherent demodulator suitable for use in the system of FIG. 1.

Demodulator 26 of FIG. 1 is a coherent demodulator of the phase locked loop type which is used to recover the 31 Hz direction information modulation from the receiver IF signal. A simplified block diagram of demodulator 26 is seen in FIG. 2 and is helpful in explaining the function of the demodulator. Reference to FIG. 2 should now be made. The simplified demodulator consists of a frequency-phase detector 40, a low pass filter 42 and a voltage controlled oscillator (VCO) 44. The receiver IF signal is applied to detector 40 together with the signal from VCO 44 with the error signal therefrom comprising the recovered phase modulation which, in addition to being further processed to drive the ADF indicator as previously described, is also applied through lowpass filter 42 to control VCO 44. Because of the closed phase locked loop the VCO frequency is theoretically always the same as the intermediate frequency. However, as previously described, environmental factors can degrade loop stability. Thus, a stability loop 46 which receives the VCO 44 signal is provided to produce a further error signal which is combined with the above mentioned error signal to maintain stability in the phase locked loop.

Low pass filter 42 is designed to have a very slow time constant. This slow time constant keeps the rapid phase modulation produced by detector 40 from affecting the VCO. However, in trying to keep the VCO output in-phase with the IF signal, detector 40 produces an output voltage which is directly proportional to the phase modulation of the IF signal.

Figure 3:
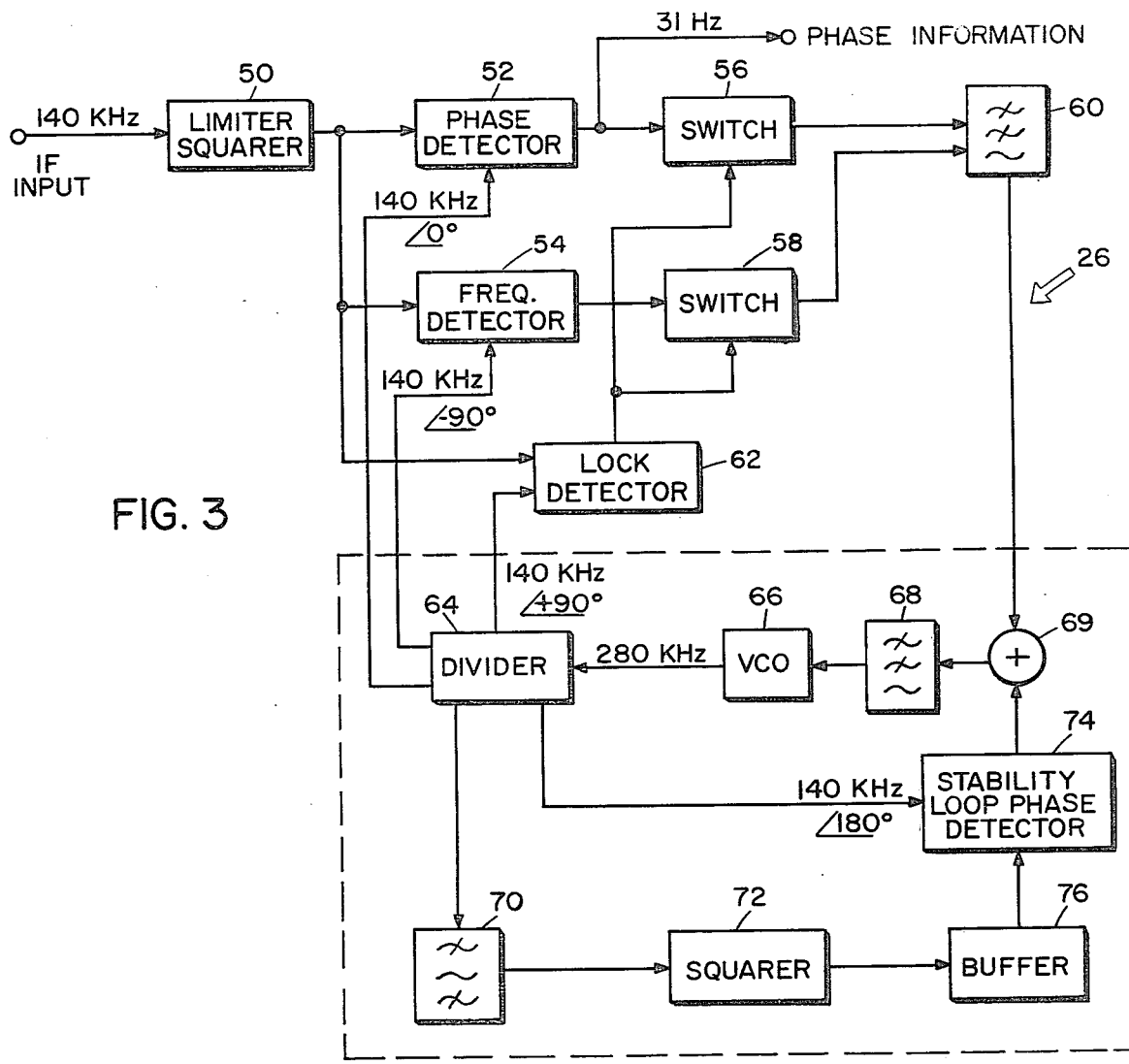
FIG. 3 is a block diagram which shows in fuller detail the demodulator of FIG. 2.

An actual coherent demodulator 26 is seen in greater detail in FIG. 3, reference to which figure should now be made and wherein it is assumed that the IF input is 140 KHz phase modulated by a 31 Hz signal in accordance with direction information as previously mentioned. As can be seen, the actual demodulator is considerably more complex than the simplified circuit just described. The IF input is applied to a limiter and squarer 50 wherein the IF signal is converted to a train of rectangular pulses having the same phase modulation as the input signal. The squared IF signal is applied to a phase detector 52, suitably an exclusive OR gate whose other input is a 140 KHz square wave from divider 64. The squared IF signal is also applied to a frequency detector 54 whose second input is a 140 KHz square wave from divider 64 which lags the first square wave by 90°, and to lock detector 62 whose second input is a 140 KHz square wave from divider 64 which leads the first square wave by 90°. More will be said below about detectors 52, 54 and 62 which together with switches 56 and 58 and limiter squarer 50 comprise detector 40 of FIG. 2.

Figure 4:
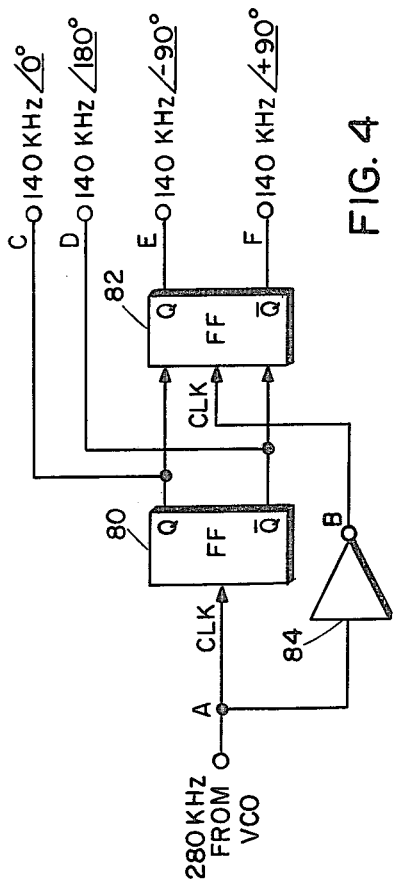
FIG. 4 shows in detail the divider of FIG. 3.
Figure 5:
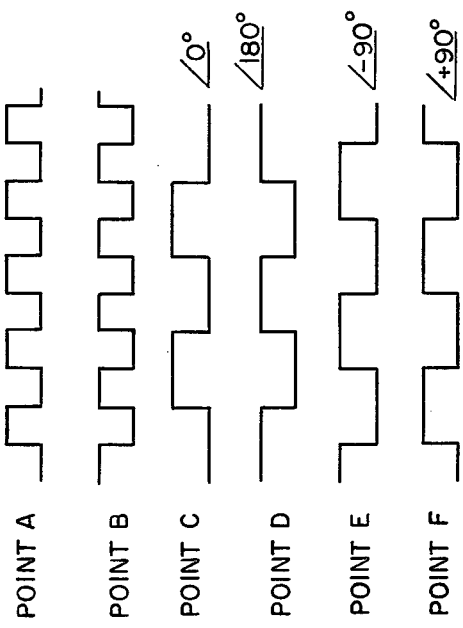
FIG. 5 shows the waveforms of signals at various points in the circuit of FIG. 4.

In this embodiment divider 64, which together with VCO 66 comprises VCO 44 of FIG. 2, is simply two cascaded flip-flops 80 and 82 as seen in FIG. 4 wherein flip-flop 80 receives at its clock terminal (Point A) a 280 KHz signal from voltage controlled oscillator (VCO) 66 of FIG. 3. The 280 KHz signal at Point A is seen in FIG. 5, reference to which should also be made. The signal at Point A is inverted in inverter 84 to produce the square wave at Point B which comprises the clock for flip-flop 82. The signal at the Q output terminal of flip-flop 80 (Point C) is the 140 KHz ∠0° signal and is applied to the set input terminal of flip-flop 82. The signal at the Q output terminal of flip-flop 80 (Point D) is the 140 KHz ∠180° signal and is applied to the reset input terminal of flip-flop 82. In this embodiment the various flip-flops are triggered at the negative-going transitions of their clock signals, thus producing the signals already described and in addition the 140 KHz ∠−90° signal and the 140 KHz ∠+90° signal respectively at the Q and Q̄ output terminals (Points E and F) of flip-flop 82.

Returning to FIG. 3, the remainder of this phase locked loop is made up of low pass filters 60 and 68, which together comprise low pass filter 42 of FIG. 2.

Only one of detectors 52 and 54 at a time is effective to control the aforementioned phase locked loop. This is accomplished by closing one of switches 56 and 58 and opening the other under the control of a signal from lock detector 62. Frequency detector 54 is selected until loop frequency lock is achieved and thereafter phase detector 52 is selected. Frequency detector 54 is used to capture the IF signal and phase detector 52 is used to lock onto the IF signal because of the characteristics of the IF signal and the required performance of the demodulator. Specifically, the IF signal has a relatively wide bandwidth, thus requiring a detector having a relatively wide capture range, while in order to provide undistorted recovered phase modulator a detector which closely follows the IF input is required. In other words, a closely locked phase locked loop is required to provide high fidelity phase demodulation. Of course, as known to those skilled in the art, the narrower the pass band of the phase locked loop low pass filter the more closely locked will be the loop. However, it is also generally true that the narrower the pass band of the loop filter the narrower the capture range of the loop detector. The use of two switchable detectors resolves the anomaly. Frequency detector 54 is a type II phase comparator such as phase comparator II in Motorola semiconductor circuit MC 14046. A type II phase comparator has a constant, relatively wide capture range which is not dependent upon the characteristics of the loop low pass filter. However, the phase comparator II does not permit reliable close locking of the two input signals. A type I phase comparator such as phase comparator I in the same Motorola semiconductor circuit, which is actually an exclusive OR gate, permits close locking but with a limited capture range. As known to those skilled in the art, close tracking provided by an exclusive OR gate occurs with the signals 90° out of phase. In order that the switch from frequency detector 54 to phase detector 52 be accomplished smoothly the 140 KHz reference to one detector is displaced 90° from the 140 KHz reference to the other detector. In this embodiment the reference to detector 54 lags the reference to detector 52 by 90°.

Lock detector 62 is simply another type I phase comparator such as an exclusive OR gate which generates no output signal in the absence of lock. Under these conditions switch 58 is closed and switch 56 is open so that frequency detector 54 is effective. When the signal from divider 64 is locked to the IF signal lock detector 62 generates an output signal which opens switch 58 and closes switch 56 thus making phase detector 52 effective.

Fine control of VCO 66 output frequency is provided by the stabilizer loop comprised of band pass filter 70, squarer 72, buffer 76 and stability loop phase detector 74 which is suitably a further exclusive OR gate. Detector 74 compares one signal, the 140 KHz ∠180° output from divider 64 which goes directly to the detector with the 140 KHz ∠+90° signal from divider 64 which goes to the detector through filter 70, squarer 72 and buffer 76. Filter 70 is, for example, an L/C filter having a very narrow pass band. A slight deviation of the divider output signal from 140 KHz will cause the signal output from filter 70 to change, thus causing detector 74 to generate an error signal to restore the divider frequency to 140 KHz. Squarer 72 and buffer 76 merely restore the original shape to the 140 KHz ∠+90° signal after processing by filter 70.

The error signal from detector 74 is summed with the signal from low pass filter 60 in summing circuit 69 with the sum being applied through low pass filter 68 to control VCO 66.

Figure 7:
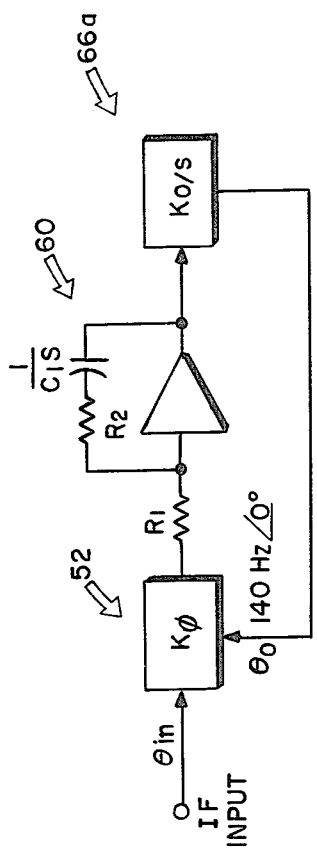
FIG. 7 is a block diagram of the circuit of FIG. 3 which permits easier mathematical analysis of the circuit.

Refer now to FIG. 7 which illustrates a simplified block diagram of the device of FIG. 3 but which is helpful in explaining a mathematical model of the device. In FIG. 7 phase detector 52 is seen to have a transfer function of Kφ, while VCO 66a, that is VCO 66 of FIG. 3 and the stability loop, has a transfer function of Ko/S. For mathematical purposes the IF input (from element 50 of FIG. 3) is termed θin and the signal from divider 64 of FIG. 3 is termed θo. The loop equation is:

$$\frac{\theta O}{\theta in} = \frac{\frac{K\phi K o}{T_1}(1 + T_2 S)}{S^2 + \frac{K\phi K o T_2 S}{T_1} + \frac{K\phi K o}{T_1}} = \frac{\omega n^2 (1 + T_2 S)}{2 + 2\lambda \omega_n S + \omega_n^2}$$

where: λ is the loop damping factor and is equal to 0.6 in this embodiment.

$$\omega_n = 2\pi 6 \frac{\text{radians}}{\text{sec}} \text{ as previously described,}$$

and $T_1$ and $T_2$ are active filter time constants.

Since the loop bandwidth can only be reduced, practically, to 6 Hz while the demodulated information is about 31 Hz, it becomes important to control or obviate $\lambda$, $\omega_n$ and $T_2$ since variations therein cause ADF bearing errors according to:

$$\theta = \frac{\tan^{-1} 2\pi f T_2}{\tan^{-1} \frac{2\lambda f/f_n}{1 - f^2/f_\lambda^2}}$$

as known to those skilled in the art.

Figure 8:
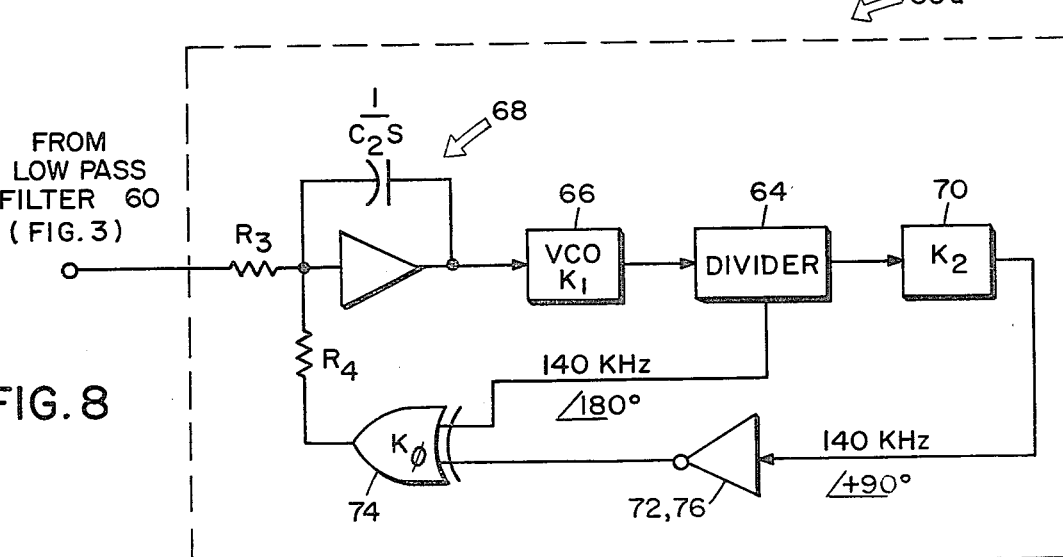
FIG. 8 is a block diagram of an equivalent VCO which includes the system VCO and the stability loop.

As aforementioned, the stability loop 66a is used to provide the desired demodulator stability. Stability loop 66a is seen in somewhat different format in FIG. 8, reference to which should now be made. It should be noted that stability loop 66a can be considered to be an equivalent voltage controlled oscillator which responds to error signals from low pass filter 60 of FIG. 3 and which contains a small VCO 66. The gain, $K_1$, of a standard VCO such as VCO 66 is about 40,000 cycles/-volt-sec while for stability of the demodulator it is desired that the gain be substantially less. The stability loop in this embodiment effectively eliminates the high gain $K_1$ and substitutes a low gain, herein termed Ko where:

$$Ko = \frac{fo}{Vin}$$

where Vin is the error signal from low pass filter 60 and fo is in this embodiment 140 Khz, the main loop frequency. In FIG. 8 the error signal from low pass filter 60 is added to the stability loop error signal from stability loop phase detector (exclusive OR gate) 74 by means of the adder comprised of resistors $R_3$ and $R_4$. The total error signal passes through low pass filter 68 to VCO 66 whose output signal is processed by divider 64 as previously described with respect to FIG. 4. The 140 KHz $\angle +90°$ signal from divider 64 is passed through filter 70 having a transfer function $K_2$ to squarer/buffer 72, 76 which is in the form of an inverter. The signal from the squarer/buffer is applied as one input to phase detector 74 whose other input is the 140 KHz $\angle 180°$ signal from divider 64 which has a transfer function $K\phi$. Note that this transfer function is essentially identical to the transfer function of detector 52 of FIG. 3 which is, of course, also an exclusive OR gate. The transfer function for the equivalent VCO 66a is:

$$Ko = \frac{fo}{Vin} = \frac{\frac{R_3}{R_4 K_2 K_\phi}}{1 + \frac{C_2 R_3 S}{K_1 K_2 K_\phi}} = \frac{\frac{R_3}{R_4 K_2 K_\phi}}{1 + \frac{S}{\omega_o}}$$

$$\text{where} \quad \omega_o = \frac{K_1 K_2 K_\phi}{C_2 R_3}.$$

In the present case $\omega << \omega_o$ thus the above transfer function simplifies to:

$$K_o = \frac{R_3}{R_4 K_2 K_\phi},$$

thus effectively eliminating the large gain, $K_1$, of VCO 66 from consideration. $K_o$ is basically a function of the four stable variables $R_3$, $R_4$, $K_2$ and $K_\phi$. Other non-linearities and gain variations are thus obviated. In addition, the normal center frequency, 140 KHz, is now controlled by the stability of filter 70 ($K_2$). The linearity and dynamic characteristics of this filter, which in this embodiment is a stable, single tuned L/C circuit resonant at 140 KHz with a loaded Q of 9.1 is shown in FIG. 9 to be comprised of series resistor 100 of 10K ohms, shunt capacitor 102 of 1000 picofarads and shunt inductor of 1.3 millihenrys.

A loaded Q of 9.1 for filter 70 produces a bandwidth of 1540 Hz. If one allows the Q to increase, the bandwidth or dynamic range of the demodulator decreases. This would be the case for higher Q circuits employing either piezoelectric or ceramic filters. This illustrates a direct tradeoff for increased center frequency stability at the expense of decreased dynamic range.

Figure 6:
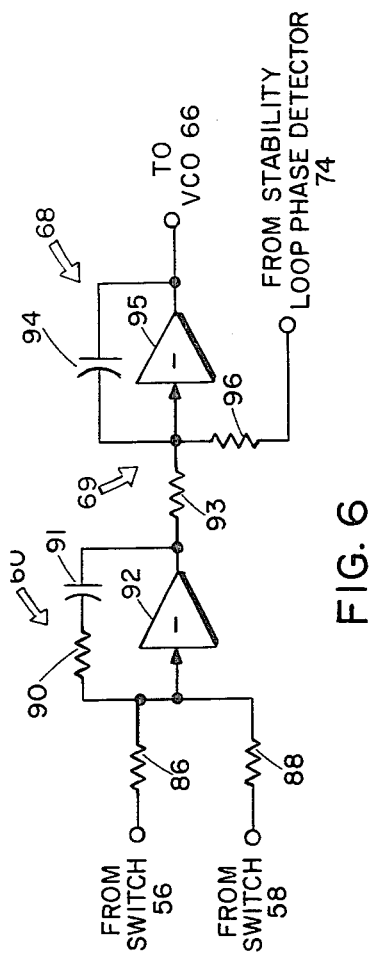
FIG. 6 is a schematic of the loop filters of FIG. 3.

As previously mentioned, filters 60 and 68 should have a relatively long time constant to prevent the rapidly changing phase modulation from affecting the VCO. In practice, filters 60 and 68 have the form of integrators and are seen at FIG. 6, reference to which should now be made. Filter 60 is comprised of operational amplifier 92 having resistor 90 and capacitor 91 serially connected between its negative input terminal and output terminal. The phase locked loop error signal is applied to filter 60 through either resistor 86 or 88 depending on whether switch 56 or 58 is closed. Summing circuit 69 is comprised of resistor 93 connected from the output terminal of operational amplifier 92 to the negative input terminal of operational amplifier 95 and resistor 96 which is connected between the output terminal of detector 74 and the same operational amplifier 95 input terminal. Operational amplifier 95 comprises low pass filter 68 and includes capacitor 94 connected between its input terminal and its output terminal which is connected to the control terminal of VCO 66.

Having shown and explained the operation of the above embodiment of my invention various modifications and alterations thereof should now be obvious to one skilled in the art. Accordingly, the invention is to be limited by the scope and true spirit of the appended claims.

The invention claimed is:

1. Means for demodulating a first frequency signal so as to recover phase modulation information impressed thereon, including a phase locked loop comprising:

a frequency detector responsive to said first frequency signal and a second frequency signal for generating an error signal, said frequency detector being a type II phase comparator having a relatively wide capture range but relatively loose lock characteristics;

a phase detector responsive to said first and second frequency signals for generating said error signal, said phase detector being a type I phase comparator having a relatively narrow capture range but relatively tight lock characteristics;

switch means responsive to the locked state of said phase locked loop for selecting said frequency detector to generate said error signal during the period said phase locked loop is unlocked and for selecting said phase detector to generate said error signal when said phase locked loop is locked;

voltage controlled oscillator means responsive to said error signal as applied thereto for generating said second frequency signal whose frequency is equal to the frequency of said first frequency signal; and, a relatively long time constant low pass filter for processing said error signal before it is applied to said voltage controlled oscillator means.

2. The means for demodulating of claim 1 with additionally a second, stability, loop means comprising a further phase detector for generating a stability signal responsive to said second frequency signal directly and said second frequency signal as passed through a narrow band pass filter, said narrow band pass filter comprising a portion of said stability loop, said voltage controlled oscillator means being additionally responsive to said stability signal to maintain the proper frequency of said second frequency signal.

3. The means for demodulating of claim 2 wherein said phase locked loop includes a summing means for summing said error signal with said stability signal whereby said voltage controlled oscillator means responds to the sum of said error signal and said stability signal to generate said second frequency at the proper frequency locked to said first frequency signal.

4. The means for demodulating of claim 1 wherein said first frequency signal comprises the intermediate frequency signal of an aircraft automatic radio direction finder, said intermediate frequency signal being phase modulated with information related to the bearing of a received radio broadcast station from the aircraft.

5. The means for demodulating of claim 1 wherein said relatively long time constant low pass filter comprises means for integrating said error signal.

6. The means for demodulating of claim 1 wherein said phase detector comprises an exclusive OR gate.

* * * * *

UNITED STATES PATENT OFFICE
CERTIFICATE OF CORRECTION

Patent No. 4,135,191  Dated 1-16-79

Inventor(s) Joseph J. Sawicki

It is certified that error appears in the above-identified patent and that said Letters Patent are hereby corrected as shown below:

In column 6, line 60, the denominator reading

"$2 + 2\lambda\omega_n S + \omega_n^2$" should read --$S^2 + 2\lambda\omega_n S + \omega_n^2$--.

In column 7, line 10, the expression reading

"$1 - f^2/f\lambda^2$" should read --$1 - f^2/f_n^2$--.

Signed and Sealed this

*Fifteenth* Day of *May 1979*

[SEAL]

Attest:

RUTH C. MASON
*Attesting Officer*

DONALD W. BANNER
*Commissioner of Patents and Trademarks*